United States Patent
Tzu et al.

(10) Patent No.: US 10,793,951 B2
(45) Date of Patent: Oct. 6, 2020

(54) APPARATUS TO IMPROVE SUBSTRATE TEMPERATURE UNIFORMITY

(71) Applicant: APPLIED MATERIALS, INC., Santa Clara, CA (US)

(72) Inventors: Gwo-Chuan Tzu, Sunnyvale, CA (US); Kazuya Daito, Milpitas, CA (US); Sang-Hyeob Lee, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/960,183

(22) Filed: Apr. 23, 2018

(65) Prior Publication Data

US 2018/0237916 A1  Aug. 23, 2018

Related U.S. Application Data

(62) Division of application No. 14/484,613, filed on Sep. 12, 2014, now Pat. No. 9,957,615.

(60) Provisional application No. 61/877,670, filed on Sep. 13, 2013.

(51) Int. Cl.
| | |
|---|---|
| C23C 16/46 | (2006.01) |
| C23C 16/458 | (2006.01) |
| C23C 16/455 | (2006.01) |
| H01L 21/687 | (2006.01) |

(52) U.S. Cl.
CPC .......... *C23C 16/46* (2013.01); *C23C 16/4586* (2013.01); *C23C 16/45544* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 5,314,574 A * | 5/1994 | Takahashi | H01L 21/02049 438/706 |
| 5,589,003 A | 12/1996 | Zhao et al. | |
| 5,834,737 A | 11/1998 | Hirose et al. | |
| 5,891,251 A | 4/1999 | MacLeish et al. | |
| 6,120,608 A * | 9/2000 | Shendon | C23C 16/4586 118/50 |
| 6,159,299 A * | 12/2000 | Koai | C23C 16/45521 118/715 |
| 6,301,434 B1 | 10/2001 | McDiarmid et al. | |
| 6,859,616 B2 | 2/2005 | Kusuda et al. | |
| 7,927,425 B2 | 4/2011 | Chiang et al. | |

(Continued)

*Primary Examiner* — Karla A Moore
*Assistant Examiner* — Tiffany Z Nuckols
(74) *Attorney, Agent, or Firm* — Moser Taboada

(57) ABSTRACT

Apparatus for improving substrate temperature uniformity in a substrate processing chamber are provided herein. In some embodiments, a substrate support processing chamber may include a chamber body having a bottom portion and a sidewall having a slit valve opening to load and unload substrates, a pin lift mechanism, disposed in a pin lift mechanism opening formed in the bottom portion of the chamber body, having a plurality of substrate support pins coupled to the pin lift mechanism, a movable substrate support heater having substrate support portion and a shaft, and a cover plate disposed about the shaft of the movable substrate support, wherein the cover plate covers the pin lift mechanism and pin lift mechanism opening.

8 Claims, 3 Drawing Sheets

(56) References Cited

U.S. PATENT DOCUMENTS

| | | |
|---|---|---|
| 2003/0029564 A1* | 2/2003 | Brown .................. H01J 37/321 |
| | | 156/345.1 |
| 2004/0221808 A1 | 11/2004 | Kawano |
| 2008/0274604 A1* | 11/2008 | Sanchez .............. C23C 16/4581 |
| | | 438/507 |
| 2009/0176381 A1 | 7/2009 | Hiyama et al. |
| 2010/0279008 A1 | 11/2010 | Takagi |
| 2013/0133834 A1 | 5/2013 | Dhindsa |
| 2016/0258061 A1 | 9/2016 | Tsai et al. |

* cited by examiner

APPARATUS TO IMPROVE SUBSTRATE TEMPERATURE UNIFORMITY

CROSS-REFERENCE TO RELATED APPLICATIONS

This application is a divisional of co-pending U.S. patent application Ser. No. 14/484,613, filed Sep. 12, 2014, which also claims benefit of U.S. provisional patent application Ser. No. 61/877,670, filed Sep. 13, 2013, which are herein incorporated by reference in their entireties.

FIELD

Embodiments of the present disclosure generally relate to an apparatus for improving substrate temperature uniformity during substrate processing.

BACKGROUND

Atomic layer deposition (ALD) and chemical vapor deposition (CVD) are two exemplary methods used in semiconductor fabrication to deposit thin films on a substrate. ALD and CVD processes generally include introducing a process gas to a process chamber in which a substrate, such as a semiconductor substrate, is supported on a substrate support.

Heated ceramic substrate supports or plates have been found useful in at least ALD and CVD processing. However, the inventors have observed that the heater temperature can be non-uniform across the surface of the heater due to the configuration of the process chamber. For example, in some chamber configurations, the inventors have observed that the temperature can be non-uniform over the area of the heater that covers a pin lift hoop opening in the bottom of the chamber, and a slit valve opening in the side of the chamber that is used for loading and unloading substrates for processing.

Thus, the inventors have provided an apparatus and processing chamber for improving substrate temperature uniformity.

SUMMARY

Apparatus for improving substrate temperature uniformity in a substrate processing chamber are provided herein. In some embodiments, a substrate support processing chamber may include a chamber body having a bottom portion and a sidewall having a slit valve opening to load and unload substrates, a pin lift mechanism, disposed in a pin lift mechanism opening formed in the bottom portion of the chamber body, having a plurality of substrate support pins coupled to the pin lift mechanism, a movable substrate support heater having substrate support portion and a shaft, and a cover plate disposed about the shaft of the movable substrate support, wherein the cover plate covers the pin lift mechanism and pin lift mechanism opening.

In some embodiments, an apparatus for improving substrate temperature uniformity in a substrate processing chamber may include a cover plate that covers a bottom portion of a substrate processing chamber, the cover plate comprising, a disk body having a central opening, an outer lip, an upper surface extending to the outer lip, and a lower surface, an annular groove formed in the lower surface, wherein the annular groove aligns with and covers a pin lift hoop opening located in the bottom portion of the substrate processing chamber, and a plurality of pin lift holes are formed through the disk body where the annular groove is located.

In some embodiments, an apparatus for improving substrate temperature uniformity in a substrate processing chamber may include a movable substrate support heater having an outer edge and a bottom surface, an annular skirt disposed about the movable substrate support heater, the annular skirt comprising an annular body having a central opening, an upper surface, a lower surface, and an outer lip that extends downward, wherein the an outer surface of the outer lip is substantially perpendicular to the upper surface, and a plurality of brackets attached along the outer edge of the movable substrate support, wherein the plurality of brackets support the annular skirt when the movable substrate support heater is in a raised processing position.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
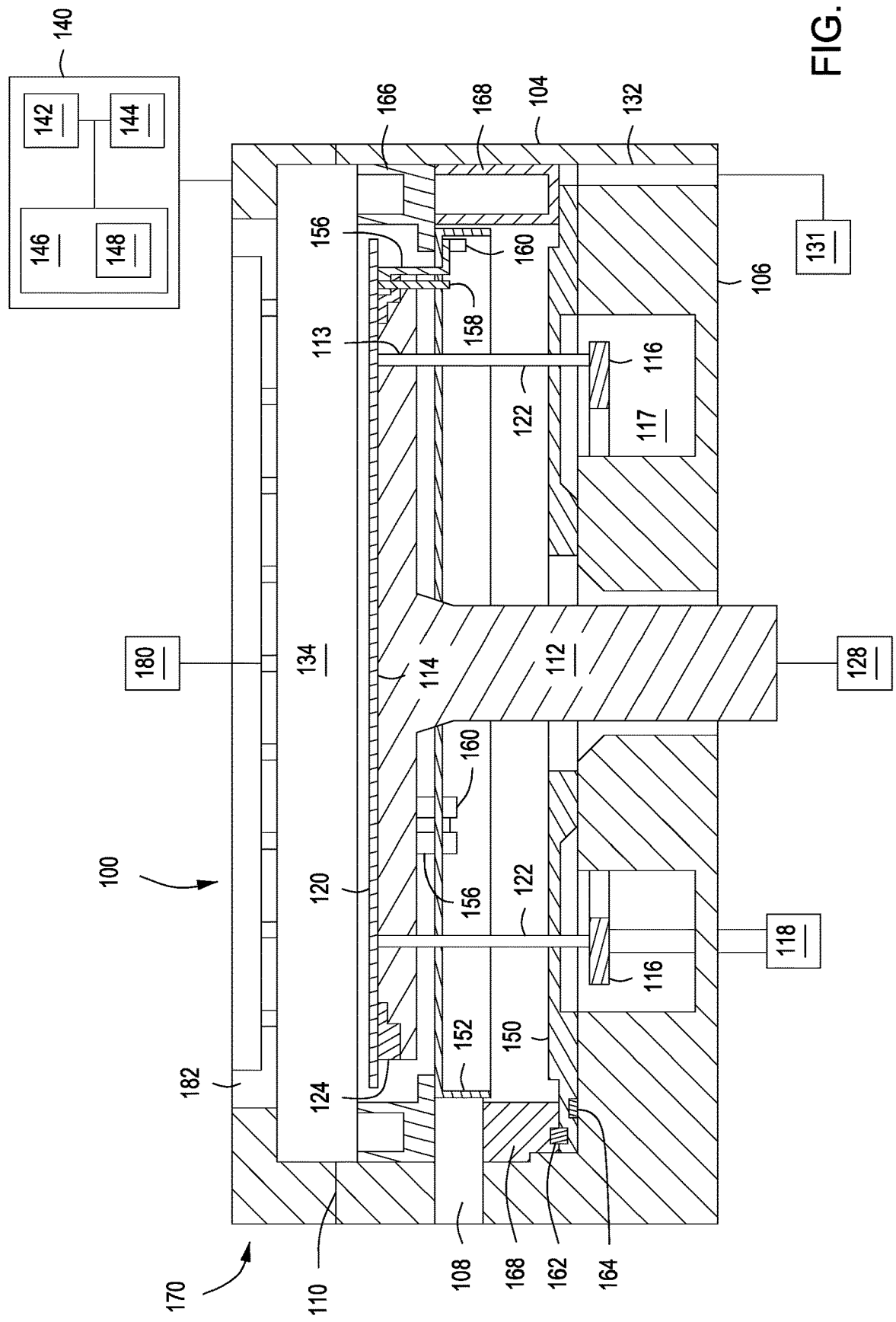
FIG. 1 depicts a schematic side view of a substrate processing system in accordance with some embodiments of the present disclosure.

To facilitate understanding, identical reference numerals have been used, where possible, to designate identical elements that are common to the figures. The figures are not drawn to scale and may be simplified for clarity. In this document, relational terms such as first and second, top and bottom, lower and upper, and the like may be used solely to distinguish one entity or action from another entity or action without necessarily calling for or implying any actual such relationship or order between such entities or actions. It is contemplated that elements and features of one embodiment may be beneficially incorporated in other embodiments without further recitation.

DETAILED DESCRIPTION

Embodiments of the present disclosure related to methods and apparatus for thermally processing substrates. Embodiments of the inventive apparatus may provide improved substrate temperature uniformity. Specifically, substrate temperature uniformity may be achieved by covering areas of the chamber that affect the temperature of the heater, such as a bottom portion of the chamber where a pin lift hoop is disposed, and a side portion of the chamber where a slit valve opening for loading and unloading substrates is disposed.

FIG. 1 is a schematic cross-sectional view of at least one embodiment of an apparatus that may be used to perform embodiments of the present disclosure. The apparatus may be any suitable apparatus for processing substrates, for example, the GEMINI ALD chamber or the Centura ALD chamber, both available from Applied Materials, Inc., of Santa Clara, Calif. In addition, the inventive embodiments described herein may be used with any process chamber that is sensitive to temperature, including, but not limited to other types of etch chambers, physical vapor deposition chambers, rapid thermal processing chambers, and the like.

The apparatus of FIG. 1 is generally a process chamber 100 having a chamber body 106 and a chamber lid 170 disposed on an upper surface 110 of the chamber body 106 to define an interior volume 134. A substrate support 112 disposed in the interior volume 134 supports the substrate 120 on a substrate receiving surface 114. The process chamber 100 may include a lower liner/shield 168 disposed in a lower portion of the process chamber 100, and an upper line/shield 166 disposed in about a substrate and an upper portion of the substrate support (or pedestal) 112 when the substrate support 112 is in the raised processing position. In some embodiments, the substrate support 112 includes a vacuum chuck, an electrostatic chuck, or a clamp ring for securing the substrate 120 to the substrate support 112. The substrate support 112 is mounted to a lift motor 128 to raise or lower the substrate support 112 and a substrate 120 disposed thereon. A slit valve opening 108 formed in a wall 104 of the chamber body 106 facilitates entry and egress of a substrate into and out of the process chamber 100. In some embodiments, the dimensions of the slit valve opening 108 may be about 200 mm wide to about 650 mm wide. In some embodiments, the dimensions of the slit valve opening 108 may be about 473 mm wide to accommodate 450 mm substrates, or about 325 mm to accommodate 300 mm substrates. In some embodiments, the slit valve opening 108 may be between about 0.75 inches in height to about 1.375 inches in height. The dimensions may vary depending upon the size of the substrate to be processed in the process chamber 100.

Figure 2:
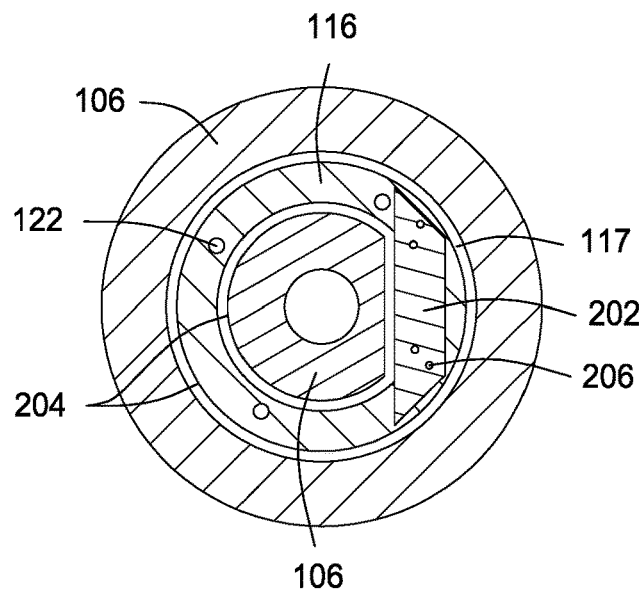
FIG. 2 depicts a cross-sectional top view of a bottom portion of a process chamber in accordance with some embodiments of the present disclosure.

In some embodiments, a pin lift mechanism is mounted in the process chamber 100 in a pin lift mechanism opening formed in the bottom portion of the chamber 100. The pin lift mechanism may be a pin lift hoop 116 coupled to a lift motor 118 and disposed in a pin lift hoop opening 117. FIG. 2 depicts a cross-sectional top view of the pin lift hoop 116 disposed in the pin lift hoop opening 117. The pin lift hoop 116 may be retained by hoop clamp 202 via hoop clamp fasteners 206. Gaps 204 may be formed between the pin lift hoop 116 and sides of the chamber body 106 in the pin lift hoop opening 117. The pin lift hoop 116 raises or lowers pins 122 movably disposed through pin openings 113 in the substrate support 112. The pins 122 raise or lower the substrate 120 over the surface of the substrate support 112. In some embodiments, the dimensions of the gaps 204 may be about 0.125 inches to about 0.5 inches wide. In some embodiments, the width of the pin lift hoop opening may be about 1 inch to about 1.75 inches wide.

In operation, the substrate support 112 is heated to increase the temperature of the substrate 120 disposed thereon. For example, the substrate support 112 may be heated using an embedded heating element, such as a resistive heater or may be heated using radiant heat, such as heating lamps disposed above the substrate support 112. A purge ring 124 is disposed on the substrate support 112 to define a purge channel which provides a purge gas to a peripheral portion of the substrate 120 to prevent deposition thereon during processing. The substrate support 112 may be fabricated from metallic materials, such as, for example, aluminum, or nonmetallic materials, such as ceramics and the like.

In some embodiments, the substrate support 112 may be a ceramic heater which having a thin thickness for retaining and heating a substrate 120 disposed thereon. The inventors have observed that the thin heater thickness on ceramic heaters/substrate supports is very sensitive to environmental conditions that may affect the heater temperature. For example, the area of the substrate support 112 located directly over the circular pin lift hoop opening 117, over gaps 204, or over the hoop clamp 202, may have different temperatures as compared to the rest of the substrate support heater surface. Similarly, the areas of the substrate support 112 near slit valve opening 108 may experience cooling and have lower temperatures than the rest of the substrate support. Thus, the inventors have proposed including an apparatus in the chamber 100 to improve substrate temperature uniformity. Specifically, the chamber 100 may include a cover plate 150 disposed over and covering a bottom portion of the chamber 100 (as shown in FIGS. 1, 3A, and 3B) and/or an annular skirt (as shown in FIGS. 1 and 4) to improve substrate temperature uniformity in a substrate processing chamber, as described in more detail below.

Figure 3A:
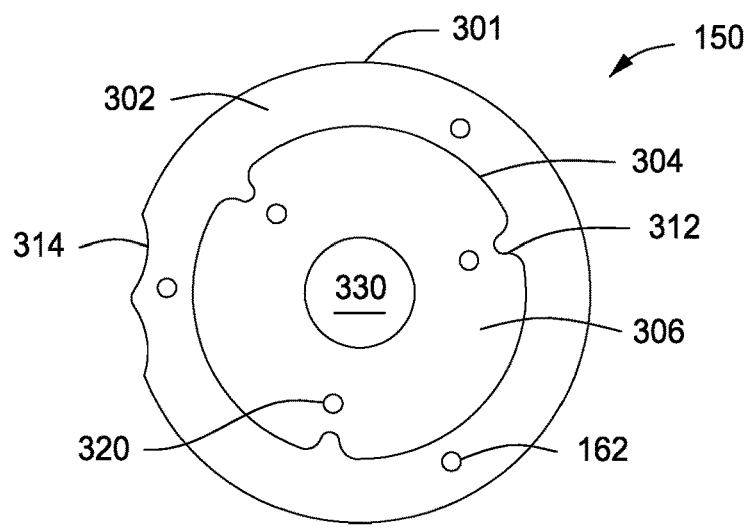
FIG. 3A depicts a cross-sectional top view of a cover plate in accordance with some embodiments of the present disclosure.
Figure 3B:
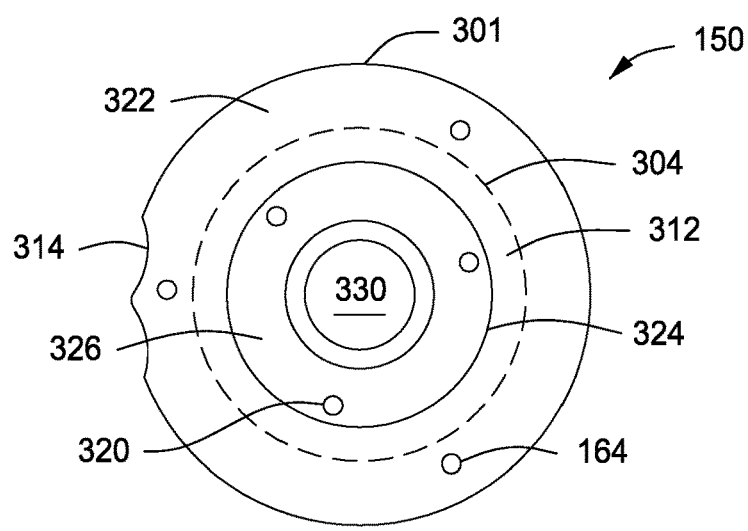
FIG. 3B depicts a cross-sectional bottom view of a cover plate in accordance with some embodiments of the present disclosure.
Figure 4:
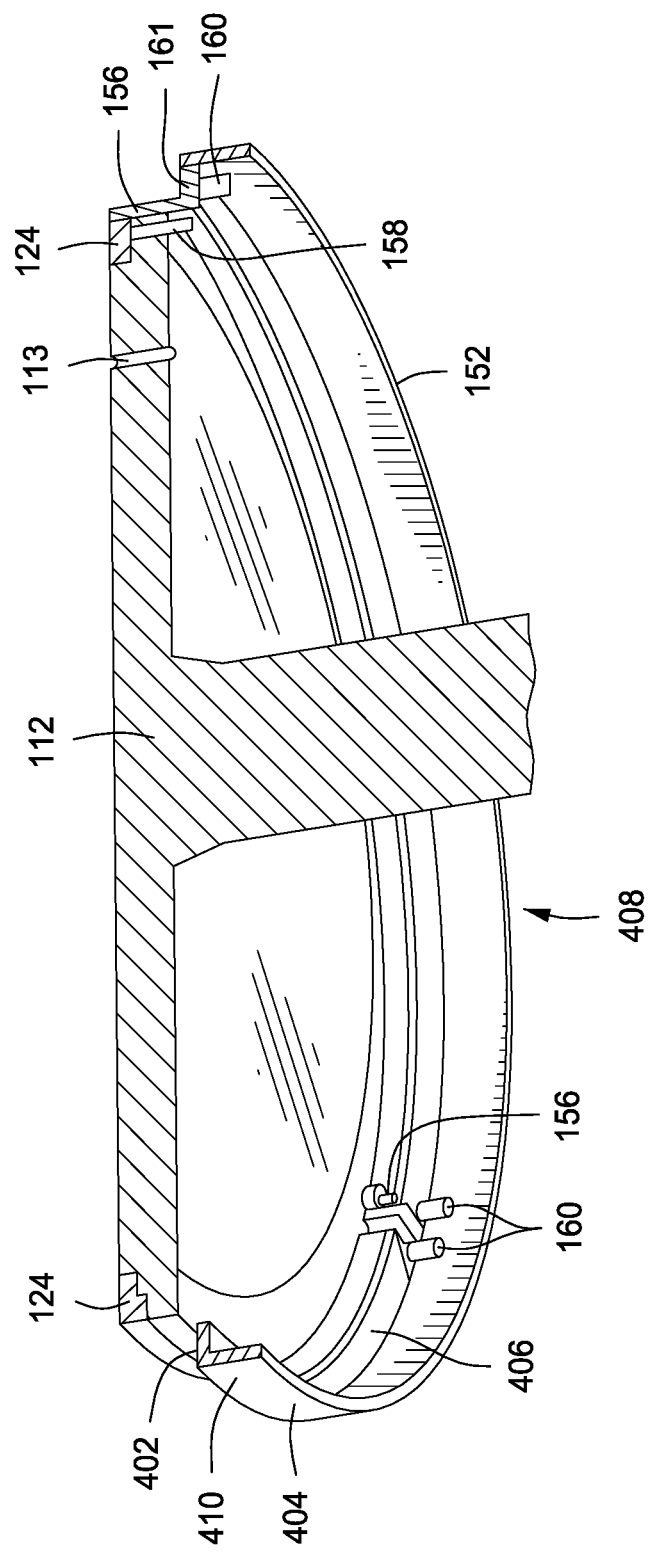
FIG. 4 depicts a cross-sectional isometric view of a portion of a substrate support and annular skirt in accordance with some embodiments of the present disclosure.

FIGS. 3A and 3B are cross-sectional top and bottom views, respectively, of an exemplary cover plate 150 according to some embodiments of the present disclosure. The cover plate 150 includes a disk body 301 having a central opening 330 through which the shaft of substrate support 112 can move. The cover plate 150 includes an outer lip 302, an upper surface 306 having an outer edge 304 and extending to the outer lip 302, and a lower surface 322. An annular groove 326 is formed in the lower surface, such that the annular groove aligns with and covers a pin lift hoop opening 117 located in the bottom portion of the substrate processing chamber 100. The annular groove 326 allows the pin lift hoop to move up and down into the groove to move the lift pins, and the substrate. In some embodiments, the annular groove 326 may be about 2.3 inches to about 3 inches wide and about 0.35 inches to about 0.50 inches deep.

In addition, a plurality of pin lifts holes 320 are formed through the disk body 301 where the annular groove 326 is located. The lift pins 122 coupled to the pin lift hoop 116 are disposed through the plurality of pin lift holes 320. The cover plate 150 further includes a plurality of upper alignment features 162 disposed on an upper surface of the outer lip 302. In some embodiments, the upper alignment features 162 may include pins disposed in recesses that couples with a process chamber component, such as, for example, lower shield 168. In some embodiments, the cover plate may include a plurality of lower alignment features 164 disposed on a lower surface of the outer lip 302. In some embodiments, the lower alignment features 164 may include pins disposed in recesses that couple with the process chamber body 106. In some embodiments, the upper surface 306 of the cover plate includes a plurality of recesses 312 that align with a plurality of brackets 156 disposed on the substrate support 112 (described below in further detail).

In some embodiments, the cover plate 150 may include a purge gas opening 314 formed along an outer edge of the outer lip 302. The purge gas opening 314 aligns with a purge gas exhaust opening located in the bottom portion of the chamber 100.

In some embodiments, the cover plate 150 has a diameter that is equal to or greater than a diameter of a substrate that is disposed in the substrate process chamber to be processed. The diameter of the upper surface 306 of the cover plate 150 may be about 300 mm to about 400 mm, or about 340 mm to about 370 mm. In some embodiments, the total diameter of the cover plate 150 may be about 400 mm to about 450 mm, or about 415 mm to about 435 mm. In some embodiments, the total thickness of the cover plate 150 may be about 5 mm to about 20 mm. The cover plate 150 may be fabricated from metallic materials or nonmetallic materials. In some embodiments, the cover plate 150 may be fabricated from any suitable material able to withstand the rigors of the process chamber environment. For example, in some embodiments the cover plate 150 may be made from Al2o3, AlN, an aluminum alloy, and the like. In certain tungsten etch processes, the cover plate 150 should not be a stainless steel material. In some embodiments, the cover plate is formed of a material that provides a constant emissivity to a backside of the substrate support 112. In other embodiments, the upper surface 306 of the cover plate is coated with a material, or surface treated, to provide a constant emissivity to a backside of the substrate support 112. For example, the upper surface may be anodized with a specific color (e.g., black or yellow, or may be surface treated to provide a mirror polish (e.g., 16 RA, 32 RA, or 64 RA surface roughness), or bead blasted to an 80 RA surface roughness. In some embodiments, only a portion of the upper surface 306 may be coated/treated.

In some embodiments, the cover plate 150 may have a uniform thickness across its entire diameter (i.e., a flat disk).

FIG. 4 depicts a cross-sectional isometric view of an annular skirt 152 in accordance with embodiments consistent with the present disclosure. The annular skirt 152 includes an annular body having a central opening 408, an upper surface 402, a lower surface 406, and an outer lip 404 that extends downward, such that the an outer surface 410 of the outer lip 404 is substantially perpendicular to the upper surface 402. In some embodiments, the central opening 408 of the annular skirt 152 has a diameter larger than the outer edge of the substrate support 112, such that the substrate support 112 may fit through the central opening 408 of the annular skirt 152.

In some embodiments, the annular skirt 152 includes a plurality of alignment features 160 coupled to the lower surface 406 of the annular skirt. In some embodiments, the plurality of alignment features 160 may be pairs of protrusions extending downward from the lower surface 406 of the annular skirt 152. The substrate support 112 may include a plurality of brackets 156 attached to an outer edge of an upper portion of the substrate support 112. The plurality of brackets 156 may each include a pin 158 disposed through an outer lip of a substrate support to fix the bracket to the substrate support 112. Each of the plurality of brackets 156 may include an outer lip 161 that extends radially outward. The outer lip 161 of each bracket 156 engages the lower surface 406 of the annular skirt 152 when the substrate support 112 is being raised and lowered.

Specifically, when the substrate support 112 is in a retracted position, the annular skirt 152 is supported by the upper surface 306 of the outer lip 302 of the cover plate 150. As the substrate support 112 moves to a processing position, as shown in FIG. 1, the outer lip 161 of each bracket engages the lower surface 406 of the annular skirt 152 between each pair of alignment features 160 to secure the annular skirt when the substrate support 112 is being raised. The annular skirt 152 is configured to cover the slit valve opening 108 when the substrate support 112 is in a raised processing position. More specifically, the outer lip 404 of the annular skirt 152 extending downward to block slit valve opening 108. In some embodiments, the outer lip 404 extends downward from about 20 mm to about 80 mm.

The inner diameter of the upper surface of the annular skirt 152 may be about 355 mm to about 600 mm. In some embodiments, the total outside diameter of the annular skirt 152 may be about 358 mm to about 602 mm. In some embodiments, the total thickness of the annular skirt 152 may be about 1.25 mm to about 5 mm. The annular skirt 152 may be fabricated from metallic materials or nonmetallic materials. In some embodiments, the annular skirt 152 may be fabricated from any suitable material able to withstand the rigors of the process chamber environment. For example, in some embodiments, the annular skirt 152 may be fabricated from Al2O3, AlN, an aluminum alloy, stainless steel, and the like. In certain tungsten etch processes, the annular skirt 152 should not be a stainless steel material.

Referring back to FIG. 1, an exhaust system 131 is in communication with a pumping channel 132 to evacuate any undesirable gases from the process chamber 100. The exhaust system 131 also helps in maintaining a pressure or a pressure range inside the process chamber 100.

The showerhead 182 (e.g., a gas inlet) may be coupled to a gas delivery system 180 for providing one or more process precursors, process gases, carrier gases and/or purge gases to the interior volume 134 of the process chamber 100 for carrying out processes in the process chamber. For example, in some embodiments, the process chamber 100 may be configured for thermal CVD processes such as the deposition of, in a non-limiting example, tungsten or tungsten-containing materials. Alternatively or in combination, other gas inlets may be provided to introduce and distribute process gases into the process chamber 100, such as nozzles or inlets disposed about the process chamber 100, in the ceiling of the process chamber, and/or within the process chamber about the substrate 120, or the like. In some embodiments, for example, such as where a solid or liquid precursor is utilized, the gas delivery system 180 may also comprise one or more ampoules. In such embodiments, the one or more ampoules may be configured to allow the solid or liquid precursor to be contained and sublime into gaseous form for delivery into the process chamber 100.

A controller 140, such as a programmed personal computer, work station computer, or the like is coupled to the process chamber 100. Illustratively, the controller 140 comprises a central processing unit (CPU) 142, support circuitry 144, and a memory 146 containing associated control software 148. The controller 140 controls the operating conditions of processes performed in the process chamber. For example, the controller 140 may be configured to control the flow of various precursor gases and purge gases from the gas delivery system 180 to the process chamber 100 during different stages of the deposition cycle.

Elements of the above-described embodiments may be combined in various ways to advantageously provide combinations of benefits provided by the different elements. For example, in some embodiments, a cover plate having a uniform thickness may be combined with an annular skirt disposed about the substrate support portion of the movable substrate support heater, such that the annular skirt covers the slit valve opening when the movable substrate support heater is in a raised processing position. In other embodiments, a cover plate including a disk body having a central opening, an outer lip, an upper surface extending to the outer lip, and a lower surface, an annular groove formed in the lower surface, wherein the annular groove aligns with and covers the pin lift mechanism opening, and a plurality of pin lift holes are formed through the disk body where the annular groove is located, wherein the plurality of substrate support pins are disposed through the plurality of pin lift holes, may be combined with an annular skirt disposed about the substrate support portion of the movable substrate support heater, such that the annular skirt covers the slit valve opening when the movable substrate support heater is in a raised processing position.

In any of the preceding embodiments, at least a portion of the cover plate may be surface treated to provide a constant emissivity to a backside of a substrate support heater. In any of the preceding embodiments, at least a portion of the upper surface of the cover plate may be coated with a material that provides a constant emissivity to a backside of a substrate support heater.

In some embodiments, a cover plate that covers a bottom portion of a substrate processing chamber may include a disk body having a central opening, an outer lip, an upper surface extending to the outer lip, and a lower surface, an annular groove formed in the lower surface, wherein the annular groove aligns with and covers a pin lift hoop opening located in the bottom portion of the substrate processing chamber, and a plurality of pin lift holes are formed through the disk body where the annular groove is located. The cover plate may include a plurality of upper alignment features disposed on an upper surface of the outer lip. In any of the preceding embodiments, the cover plate further includes a plurality of lower alignment features disposed on a lower surface of the outer lip. In any of the preceding embodiments, a purge gas opening may be formed along an outer edge of the outer lip that aligns with a purge gas exhaust located in the bottom portion of the substrate processing chamber. In any of the preceding embodiments, the upper surface of the cover plate has a diameter that is equal to or greater than a diameter of a substrate that is disposed in the substrate process chamber to be processed.

In some embodiments, an apparatus to improve substrate temperature uniformity in a substrate processing chamber may include a movable substrate support heater having an outer edge and a bottom surface, an annular skirt disposed about the movable substrate support heater, the annular skirt comprising an annular body having a central opening, an upper surface, a lower surface, and an outer lip that extends downward, wherein the an outer surface of the outer lip is substantially perpendicular to the upper surface, and a plurality of brackets attached along the outer edge of the movable substrate support, wherein the plurality of brackets support the annular skirt when the movable substrate support heater is in a raised processing position, wherein the annular skirt covers a slit valve opening formed through a side of the substrate processing chamber when the movable substrate support heater is in a raised processing position.

In any of the preceding embodiments, each of the plurality of brackets includes an outer lip that extends radially outward, and wherein the annular skirt is supported by the outer lip of each of the plurality of brackets. In any of the preceding embodiments, the lower surface of the annular skirt includes a plurality of alignment features, and wherein the outer lip of each of the plurality of brackets engages the plurality of alignment features to secure the annular skirt when the movable substrate support heater is being raised and lowered.

While the foregoing is directed to embodiments of the present disclosure, other and further embodiments of the disclosure may be devised without departing from the basic scope thereof.

The invention claimed is:

1. An apparatus to improve substrate temperature uniformity in a substrate processing chamber, comprising:
   a substrate processing chamber; and
   a cover plate that covers a bottom portion of the substrate processing chamber, wherein the cover plate is coupled to and directly supported by a bottom portion of the substrate processing chamber, the cover plate comprising:
   a disk body having a central opening, an outer lip, an upper surface extending to the outer lip, and a lower surface, wherein a plurality of purge gas openings are formed into the disk body along an outer edge of the outer lip that aligns with a purge gas exhaust located in the bottom portion of the substrate processing chamber;
   an annular groove formed in the lower surface, wherein the annular groove aligns with and covers a pin lift hoop opening located in the bottom portion of the substrate processing chamber; and
   a plurality of pin lift holes are formed through the disk body where the annular groove is located.

2. The apparatus of claim 1, wherein the cover plate further includes a plurality of upper alignment features disposed on an upper surface of the outer lip.

3. The apparatus of claim 1, wherein the cover plate further includes a plurality of lower alignment features disposed on a lower surface of the outer lip.

4. The apparatus of claim 1, wherein the upper surface of the cover plate has a diameter that is equal to or greater than a diameter of a substrate that is disposed in the substrate process chamber to be processed.

5. The apparatus of claim 1, wherein the cover plate is surface treated to provide a constant emissivity to a backside of a substrate support heater.

6. The apparatus of claim 1, wherein the upper surface of the cover plate is coated with a material that provides a constant emissivity to a backside of a substrate support heater.

7. The apparatus of claim 6, herein the upper surface of the cover plate includes a plurality of recesses that align with a plurality of clamps disposed on the substrate support heater.

8. The apparatus of claim 1, further comprising:
   an annular skirt that covers a slit valve opening formed through a side of the substrate processing chamber when a substrate support heater disposed through the central opening of the cover plate is in a raised processing position, and wherein the annular skirt is supported by the upper surface of the outer lip of the cover plate when the substrate support heater is in a retracted position.

* * * * *

UNITED STATES PATENT AND TRADEMARK OFFICE
CERTIFICATE OF CORRECTION

PATENT NO. : 10,793,951 B2
APPLICATION NO. : 15/960183
DATED : October 6, 2020
INVENTOR(S) : Gwo-Chuan Tzu et al.

Page 1 of 1

It is certified that error appears in the above-identified patent and that said Letters Patent is hereby corrected as shown below:

In the Claims

Column 8, in Claim 7, delete "herein" and substitute therefor "wherein,"

Signed and Sealed this
Twenty-fourth Day of November, 2020

Andrei Iancu
*Director of the United States Patent and Trademark Office*